United States Patent
Stine et al.

(10) Patent No.: US 7,154,115 B2
(45) Date of Patent: Dec. 26, 2006

(54) ZOOM IN PIN NEST STRUCTURE, TEST VEHICLE HAVING THE STRUCTURE, AND METHOD OF FABRICATING THE STRUCTURE

(75) Inventors: Brian E. Stine, Santa Clara, CA (US); Christopher Hess, San Ramon, CA (US); Larg H. Weiland, San Ramon, CA (US); Dennis J. Ciplickas, San Jose, CA (US)

(73) Assignee: PDF Solutions, Inc., San Jose, CA (US)

(*) Notice: Subject to any disclaimer, the term of this patent is extended or adjusted under 35 U.S.C. 154(b) by 121 days.

(21) Appl. No.: 10/508,506

(22) PCT Filed: Mar. 26, 2003

(86) PCT No.: PCT/US03/09193

§ 371 (c)(1),
(2), (4) Date: Sep. 21, 2004

(87) PCT Pub. No.: WO03/083497

PCT Pub. Date: Oct. 9, 2003

(65) Prior Publication Data

US 2005/0122123 A1      Jun. 9, 2005

Related U.S. Application Data

(60) Provisional application No. 60/368,080, filed on Mar. 27, 2002.

(51) Int. Cl.
*H01L 23/58* (2006.01)
*H01L 29/10* (2006.01)

(52) U.S. Cl. .......................................... 257/48; 438/18

(58) Field of Classification Search ................. 257/48; 438/18
See application file for complete search history.

(56) References Cited

U.S. PATENT DOCUMENTS 5,977,558 A * 11/1999 Lee ............................. 257/48
6,268,717 B1    7/2001 Jarvis et al.
6,362,634 B1    3/2002 Jarvis et al.

OTHER PUBLICATIONS

*Integrated Circuit Yield Management and Yield Analysis: Development and Implementation*; Charles H. Stapper et al.; IEEE Transactions on Semiconductor Manufacturing; vol. 8, No. 2, May 1995; pp. 95-102.
*Extraction of Defect Size Distributions in an IC Layer Using Test Structure Data*; Jitendra B. Khare et al.; IEEE Transactions on Semiconductor Manufacturing, vol. 7, No. 3, Aug. 1994; pp. 354-368.
*Defect Size Distribution In VLSI Chips*; Reinhard Glang; IEEE Transactions on Semiconductor Manufacturing, vol. 4, No. 4, Nov. 1991; pp. 265-269.

* cited by examiner

Primary Examiner—W. David Coleman
(74) Attorney, Agent, or Firm—Duane Morris LLP; Steven E. Koffs (57) ABSTRACT

A test vehicle (100) comprises a substrate (99), a plurality of nested serpentine lines (202) on the substrate, and a plurality of test pads (204) on the substrate. Each serpentine line has a plurality of turn sections that comprise two parallel line segments connected by a perpendicular line segment. Each of the plurality of test pads is connected to a respective turn section of a respective one of the nested serpentine lines. Each pair of test pads connected to one of the subset of the nested serpentine lines has at least a respectively different turn section portion connected therebetween.

28 Claims, 10 Drawing Sheets

ZOOM IN PIN NEST STRUCTURE, TEST VEHICLE HAVING THE STRUCTURE, AND METHOD OF FABRICATING THE STRUCTURE

This application claims the benefit of U.S. Provisional Patent Application No. 60/368,080 filed Mar. 27, 2002.

FIELD OF THE INVENTION

The present invention relates to semiconductor fabrication processes generally, and more specifically to test vehicles for analyzing yield of semiconductor fabrication processes.

BACKGROUND

Defects (e.g. particles) can cause electrically measurable faults (killer defects) dependent on the chip layout and the defect size. These faults are responsible for manufacturing related malfunction of chips. So, defect density and size distributions are important for yield enhancement and to control quality of process steps and product chips, as described in Staper, C. H., Rosner, R. J., "hirtegrated Circuit Yield Management and Yield Analysis: Development and Implementation," IEEE Transactions on Semiconductor Manufacturing, pp. 95–102, Vol. 8, No. 2, 1995.

Test structures are used to detect faults and to identify and localize defects. The double bridge test structure was proposed by Khare, et al., "Extraction of Defect Size Distributions in an IC Layer Using Test Structure Data," IEEE Transactions on Semiconductor Manufacturing, pp. 354–368, Vol. 7, No. 3, 1994, to extract size distributions based on electrical measurements.

Parallel lines—each connected to two pads—are implemented inside a test structure to electrically determine a defect size distribution. If a defect occurs and causes an electrically measurable fault, either two or more test structure lines are shorted or one or more test structure lines are opened. The greater the number of test structure lines involved, the larger the defect that caused this measured fault.

The principle prior art test structure of nested serpentine lines is based on a structure proposed by Glang, R., Defect Size Distribution in VLSI Chips, "IEEE Transactions on Semiconductor Manufacturing," pp. 265–269, Vol. 4, No. 4, 1991.

Glang used 5 serpentine lines within two combs, and implemented several structures having different dimensions to determine a defect size distribution by comparing the number of detected defects dependent on the dimension of the structures. Having a high number of nested serpentine lines enables the direct extraction of defect size distribution by comparing the number of detected defects dependent on the number of involved lines.

Each NEST structure is connected to a 2-by-N pad frame. In a 2-by-N pad frame, to enable the detection of opens and shorts, each test structure line is connected to two pads. So, only N/2 lines are implemented; that does not fill a relatively large chip area that is sufficient to detect random defects. For this reason, the lines are designed as serpentines to fill the complete test chip area. Thus, each line is divided into a plurality of segments between serpentine turns. The prior art structures do not provide a satisfactory method to isolate the location of a defect within a given line having a plurality of serpentine segments.

SUMMARY OF THE INVENTION

Some embodiments of the invention include a test vehicle comprising a substrate, a plurality of nested serpentine conductive lines on the substrate, and a plurality of test pads on the substrate. Each serpentine line has a plurality of turn sections that comprise two parallel line segments connected by a perpendicular line segment. The plurality of test pads are each connected to a respective portion of a respective one of the nested serpentine lines, such that each of a subset of the nested serpentine lines has at least three test pads, and each pair of consecutive test pads connected to one of the subset of the nested serpentine lines has a respectively different subset of the turn sections of that line connected therebetween.

Other embodiments of the invention include a test vehicle comprising a substrate, a plurality of nested serpentine conductive lines on the substrate, and a plurality of test pads on the substrate. Each serpentine line has a plurality of turn sections that comprise two parallel line segments connected by a perpendicular line segment. Each of the plurality of test pads is connected to a respective turn section of a respective one of the nested serpentine lines, wherein a subset of the test pads are positioned internally in the nest structure.

Other embodiments of the invention include a test vehicle comprising a substrate, a plurality of nested serpentine conductive lines on the substrate, and a plurality of test pads on the substrate. Each serpentine line has a plurality of turn sections that comprise two parallel line segments connected by a perpendicular line segment. Each of the plurality of test pads is connected to a respective turn section of a respective one of the nested serpentine lines. Each pair of test pads connected to one of the subset of the nested serpentine lines has at least a respectively different turn section portion connected therebetween.

Other embodiments of the invention include a method of testing, comprising the steps of: fabricating a test vehicle having a plurality of nested serpentine lines; probing fractional portions of individual ones of the nested serpentine lines for short circuits or open circuits; and identifying a fractional portion of at least one of the nested serpentine lines that contains a defect based on the probing.

DETAILED DESCRIPTION

U.S. Provisional Patent Application No. 60/368,080 filed Mar. 27, 2002 is incorporated by reference herein in its entirety, as though set forth fully herein.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 1:
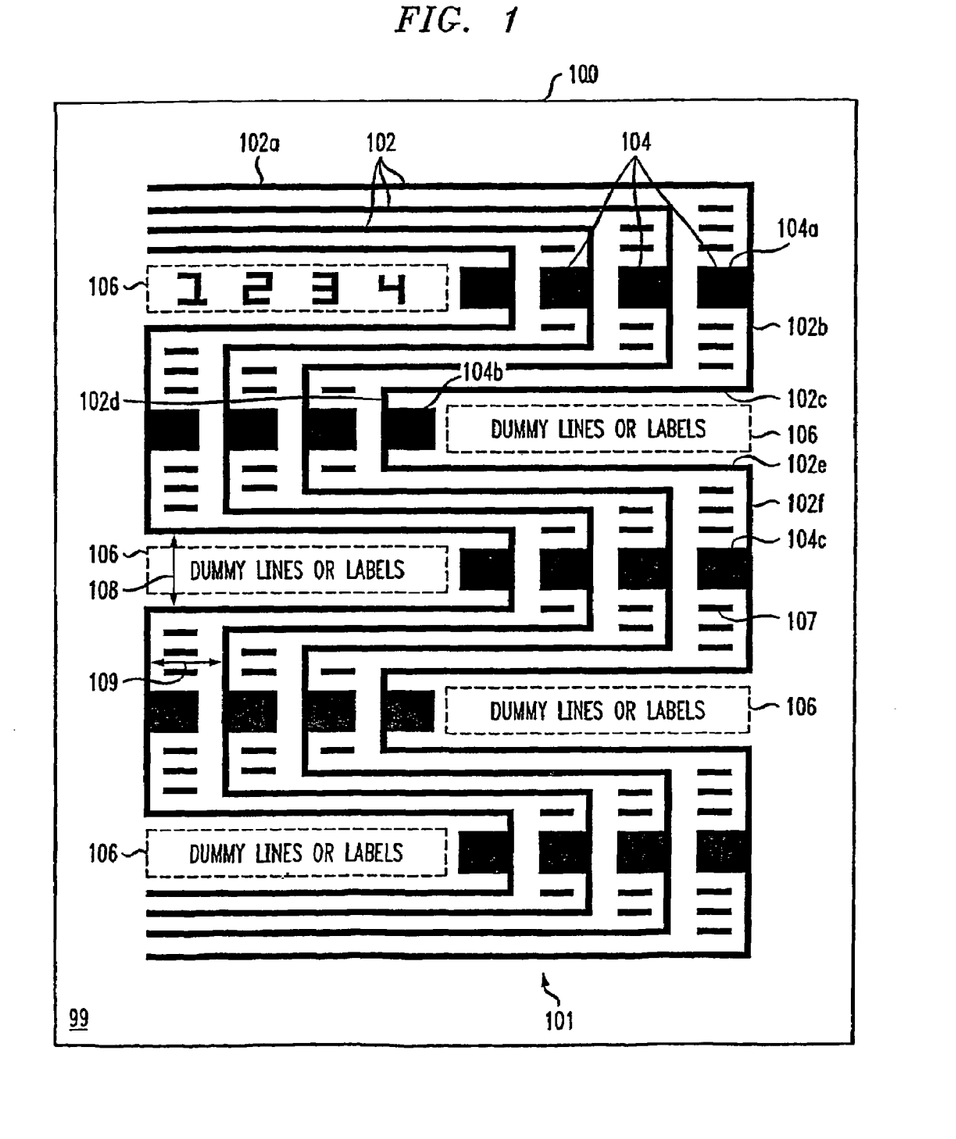
FIG. 1 is a diagram showing a test vehicle having a nest structure with internal zoom in pins.

FIG. 1 is a diagram of one embodiment of a test vehicle 100 (test wafer) having a zoom in pin nest (referred to herein as the "ZIPNest") test structure 101. The exemplary structure 101 provides a relatively large nest area, with easier fault localization than possible using previous nest designs and test methods. Electrical test of zoom-in pins (hereinafter, "ZIPs") localizes nest line open or short conditions to a selected region of a nest. This structure 101 enables the ability to observe selected systematic issues, such as corner-related shorts, iso-edge metal footer shorts, and line end shortening.

The test vehicle 100 comprises a substrate 99 having a ZIPNest structure 101 that includes: a plurality of nested serpentine conductive lines 102 on the substrate 99, and a plurality of test pads 104 on the substrate. Each serpentine line 102 has a plurality of turn sections, each turn section comprising two parallel line segments 102a, 102c connected by at least one perpendicular line segment 102b. The plurality of test pads 104 are each connected to a respective portion of a respective one of the nested serpentine lines 102, such that each of a subset of the nested serpentine lines has at least three test pads. In some embodiment, each pair of test pads connected to one of the subset of the nested serpentine lines has a respectively different subset of the turn sections of that line connected therebetween.

In some embodiments, such as that shown in FIG. 1, each pair of test pads 104 connected to one of the subset of the nested serpentine lines 102 has at least a respectively different turn section portion connected therebetween. In FIG. 1, there is one pad 104 per turn section, with the pad centered in the perpendicular line segment of the turn section. Thus any given pair of pads 104 has one half of a turn section therebetween, including one of the parallel line segments of the turn section and half of the perpendicular line segment.

In the embodiment of FIG. 1, at least a subset of the test pads 104 are positioned internally in the nest structure 101, with each of the subset of the test pads directly connected to a respective one of the turn sections. For example, all of the pads 104 shown in FIG. 1 are positioned internally in the nest structure 101, on the perpendicular line segment (e.g., 102b, 102d) of a respective turn section. These test pads are referred to below as "internal zoom in pins" or "internal ZIPs." Because the internal ZIPs affect the size of the nest, they are preferably small (e.g., 5 μm by 5 μm).

In FIG. 1, each of the subset of test pads is located between the perpendicular line segments of a respective adjacent pair of the serpentine lines.

FIG. 1 also shows an example in which at least two consecutive turn sections of one or more of the nested serpentine lines have test pads directly connected thereto. Although in FIG. 1, every turn section has a respective test pad directly connected thereto, other configurations have a fixed number of turn sections between any two test pads that are connected to the same line. For example there may be 1, 2, 3 or more turn sections between test pads.

Internal ZIPs are appropriate for hand microprobing work. Internal ZIPs can be inserted into every single turn of the nest, for detailed fault localization, or only some turns, for reduced area impact. The final area impact depends on pad size and the number of pad sets inserted. The area impact results from two effects. The smallest distance 108 between segments 102c and 102e of a single line is larger in a nest having ZIPs 104 than in a prior art nest structure. Also, the distance 109 between adjacent perpendicular segments 102b is increased in the internal ZIPNest configuration.

In the embodiment of FIG. 1, the well of the innermost turn section has dummy lines or labels 106 therein. Also, at least one of the perpendicular line segments includes one or more comb segments 107 positioned between the corresponding pad and the parallel line segments of that perpendicular line segment.

In some embodiments, internal ZIPs are used with a small but practical pad size for microprobing (1–2 μm). The area overhead may be about 11%–18% if the ZIPs 104 are inserted into every second turn of the nest 101. In one exemplary embodiment, a nest design with internal ZIPs includes a pad size of 1.5 μm. The area overhead is about 15%. This design leaves room for 1.5 μm tall failure analysis labels ("FA labels") 106 within turns of the nest 101 to aid scanning electron microscope (SEM) work in the nests.

Figure 2:
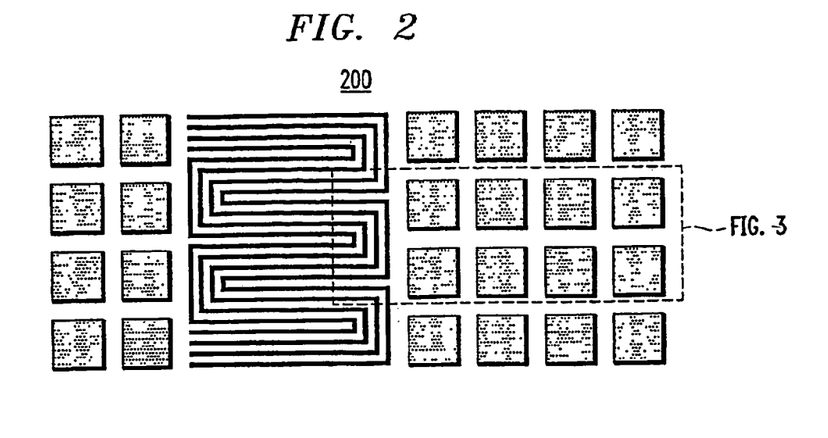
FIG. 2 is a diagram of a nest structure having external zoom in pins.

FIG. 2 shows a second exemplary embodiment of a ZIPNest 200. In ZIPNest 200, at least a subset of the test pads 204 are located external to the nest structure 200. Each of the subset of the test pads is connected between a respective pair of turn sections within the plurality of turn sections. One of the lines $202_{i,j-1}$, $202_{i,j}$, $202_{i,j+1}$ is emphasized to show a typical route taken by a line in the external zoom in pin nest.

Figure 3:
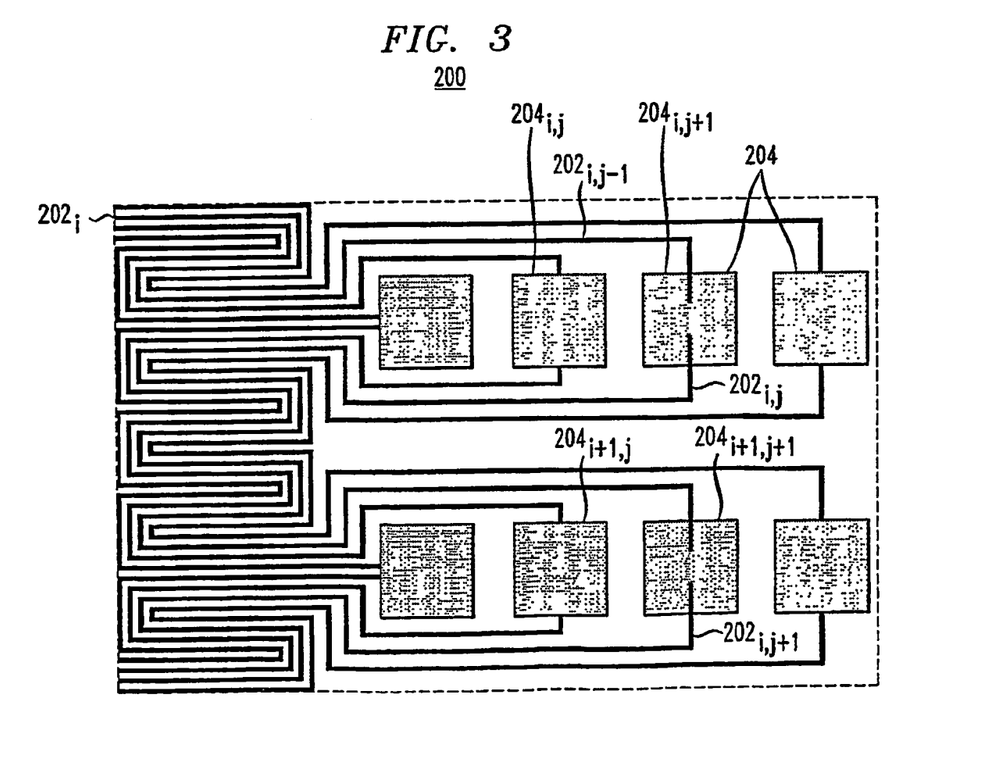
FIG. 3 is an enlarged detail of FIG. 2.

FIG. 3 is an enlarged view of a detail of FIG. 2, showing the horizontal placement of a 2×N padframe. The external zoom in pins 204 ("external ZIPs") are arranged in an evenly spaced rectangular array. This feature of external ZIPs 204 allows probing by automatic test equipment, so faults can be localized using normal test procedures. The external ZIPs can localize defects to within nest regions of the same height as the pad pitch. The exemplary Zoom-in Pin padframe has equal pad pitch in x and y directions if both opens and shorts checks are to be performed by rotating the wafer by 90 degrees on test equipment. In the example of FIGS. 2 and 3, the tester probes between, for example, pads $204_{i,j}$ and $204_{i+1,j}$ for open circuits, and the tester probes between, for example, pads $204_{i,j}$ and $204_{i,j+1}$ for short circuits. The configuration shown in FIGS. 2 and 3 can have a significant pad area overhead. However, to support automated testing, the pad spacing is relatively large. In one embodiment, using external ZIPs with a small but practical size for autoprobing (about 60 μm pitch) the area overhead is about 33%. One way to reduce the area overhead is to have a number of turns greater than one between each pair of consecutive test pads in a line. For example, a pad can be located to probe every 10 turns of the nest.

Once the FA requirements and typical procedures are understood, an area trade-off calculation can be used to check feasibility of ZIPs in a given situation. Factors to be considered include (1) whether it is desired to use automated test equipment (ATE) for fault localization, or microprobing alone is sufficient, and (2) the smallest pad size and pitch possible for ATE or microprobing equipment. For example, a determination can be made whether the 2-port method for fault localization can localize faults to within 10 turns of the nest. If so, Internal ZIPs are advantageous, because external ZIPs have larger area overhead, and the mask transmission/pattern density is larger due to the number of pads.

The nest structure 200 includes a plurality of rows of test pads, each row having a respective test pad corresponding to each respective one of the plurality of lines 202. For example, FIG. 3 shows two rows, each having four pads 204. Each row is connected at a respectively different intermediate location between ends of the plurality of nested serpentine lines. The test pads 204 of any two consecutive rows of test pads are connected to a respectively different bunch of turn sections containing one or more turn sections of each of the nested serpentine lines. The pads are further arranged in columns to form a rectangular array of pads.

Figure 4A:
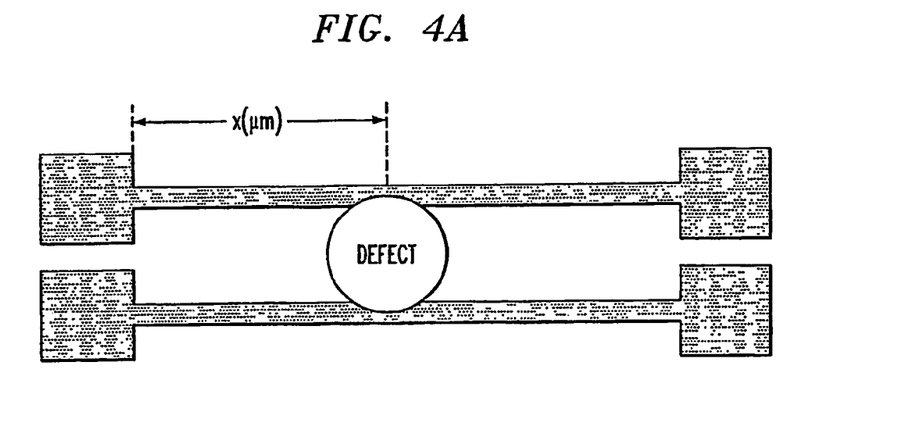
FIG. 4A is a diagram of a defect causing a short circuit between two lines.
Figure 4B:
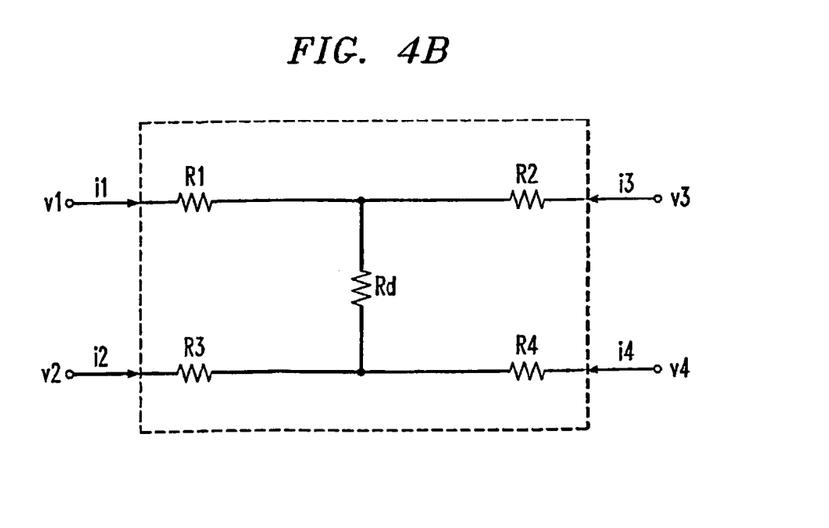
FIG. 4B is a schematic diagram of a discrete component model of the defect of FIG. 4A.

FIG. 4A shows an example of a short between two lines in a nest. FIG. 4B is a schematic diagram of an ideal model of the shorted lines of FIG. 4A. Detailed measurements of $(v_1,v_2,v_3,v_4)$ and $(i_1,i_2,i_3,i_4)$ allow calculation of $R_1,R_2,R_3,R_4$ and $R_d$. The ratio of $R_1/R_2$ is proportional to the distance of defect from probe pads. The distance X (as a function of line length) is then given by a bridge calculation using the equation: $X \sim (R_1/R_2 \approx R_3/R_4)$. The nest layout can be used to translate the distance from the probe pads into physical location within nest.

The Two Port Nest Measurement Algorithm is as follows:
Loop over nest lines pairs (i=1 . . . 15, i+1=2 . . . 16)
$v_1,v_3$ are input and output of nest line i
$v_2,v_4$ are input and output of nest line i+1
Force voltages and measure currents on $(v_1,v_2,v_3,v_4)$ (25 total measurements)
Standard leakage check
(1,1,M,M)
Port currents with auxiliary lines grounded

| (1, M, 0, 0) | (M, 1, 0, 0) | (M, 0, 1, 0) | (M, 0, 0, 1) |
| (1, 0, M, 0) | (0, 1, M, 0) | (0, M, 1, 0) | (0, M, 0, 1) |
| (1, 0, 0, M) | (0, 1, 0, M) | (0, 0, 1, M) | (0, 0, M, 1) |

Port currents with auxiliary lines floating

| (1, M, F, F) | (M, 1, F, F) | (M, F, 1, F) | (M, F, F, 1) |
| (1, F, M, F) | (F, 1, M, F) | (F, M, 1, F) | (F, M, F, 1) |
| (1, F, F, M) | (F, 1, F, M) | (F, F, 1, M) | (F, F, M, 1) |

375 total measurement per nest.
15 nest line pairs * 25 measurements per line pair.

Figure 5:
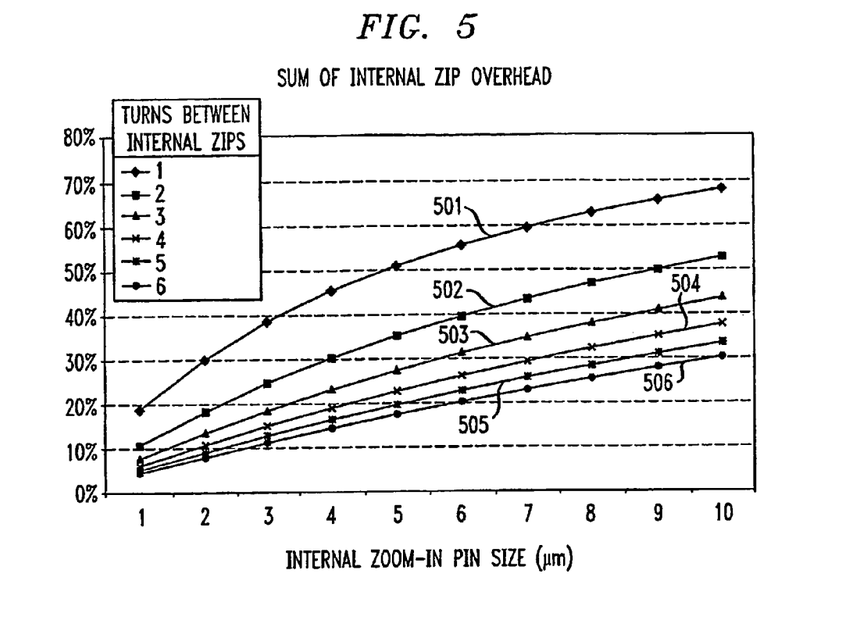
FIG. 5 is a graph showing how internal zoom in pin overhead varies as a function of pin size and the number of turns between pins.

FIG. 5 is a graph showing the internal ZIP area overhead, as a function of the ZIP pad size in μm. FIG. 5 also shows how the number of turns between internal ZIPs in a given line affects the overhead. Curves 501 to 506 represent the overhead for one through six turns between pads, respectively. For any given number of turns between ZIP pads, the ZIP overhead is a monotonically increasing function of the pin size. For any given pin size, the overhead decreases asymptotically as the number of turns between pads increases.

Figure 6:
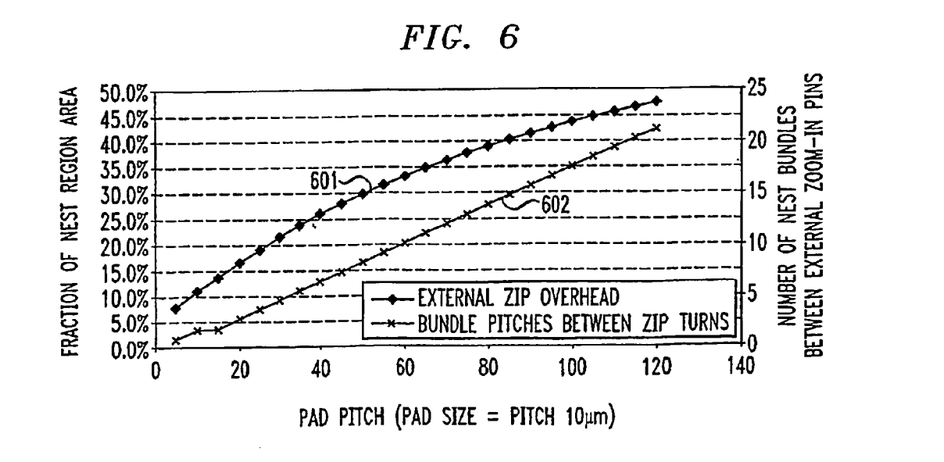
FIG. 6 is a graph showing how external zoom in pin overhead and the number of bundle pitches between turns vary with pad pitch.

FIG. 6 is a graph showing external ZIP overhead (curve 601) and the number of bundle pitches between external ZIP pins (curve 602) as functions of pad pitch (where the pad size is also a function of pitch, such that pad size=pitch−10 μm). This graph is based on a 2 mm wide nest region, with variable cell width to account for the ZIPs. Both are monotonically increasing functions. The number of bundles is approximately linear for pad pitches of at least 15 μm.

Figure 7:
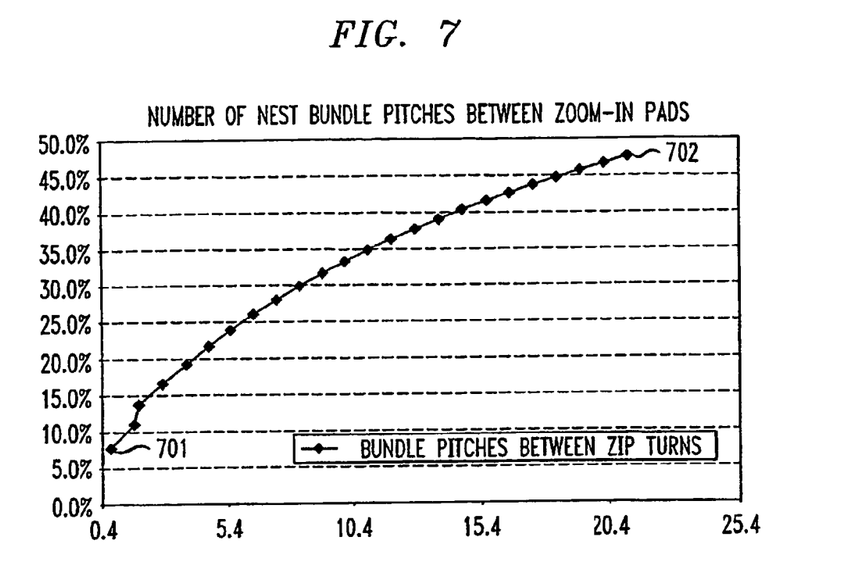
FIG. 7 is a graph showing how zoom in pin overhead varies with the number of bundle pitches between turns.

FIG. 7 is a graph showing the ZIP overhead as a function of the number of bundle pitches between external ZIP turns. Each point on the graph of FIG. 7 corresponds to a respectively different pad pitch and pad size, ranging from pitch/size pairs of 5 μm/3 μm (point 701 at the lower left corner of the curve) to 120 μm/105 μm (point 702 at the upper right end of the curve).

Figure 8:
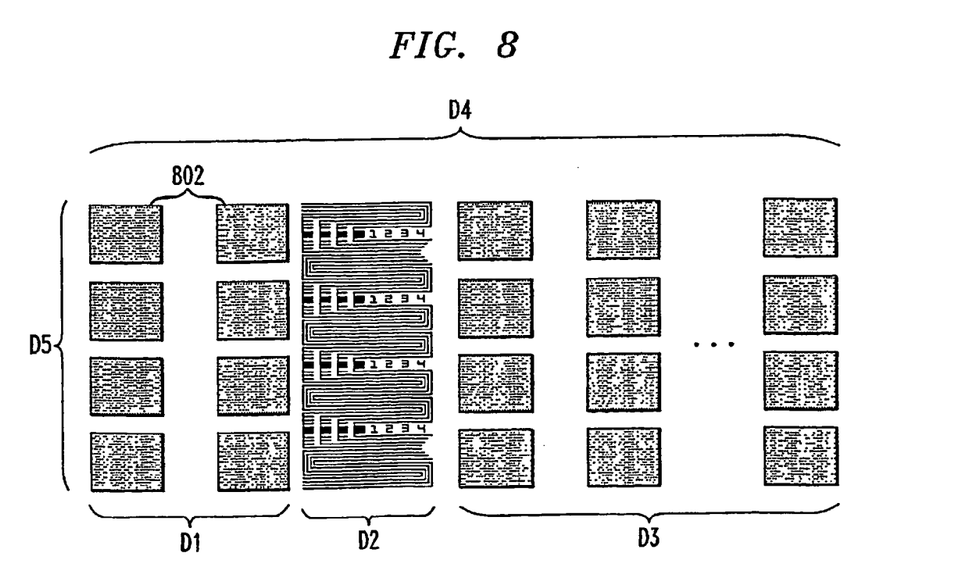
FIG. 8 is a diagram showing the layout of a nest with both internal and external zoom in pins.

FIG. 8 is an example of a ZIPNest layout. The exemplary next has 23 lines (Only four lines are shown for ease of viewing.) The internal ZIPs are placed at every fourth turn of the serpentine lines. External ZIPs are placed every 8–12 turns. Thus, it is possible to combine both internal and external ZIPs in one test vehicle. The pitch p between rows of pads is sized to accommodate 80 rows of pads. There are two columns of main nest pads, each having 80 pads, on the left side of the nest. The main nest pads 802 are coupled to the ends of each line in the nest structure. On the right side of the nest, 23 columns of pads at are provided at a 90 μm column pitch. In one example, the dimensions of the array are given by D1=200 μm, D2 is about 5800 μm, D3 is about 2100 μm, and D4 is about 8100 μm, and D5 is about 1900 μm. This is only one example, and nest structures of any desired size may be constructed.

An example of a design of experiment (DOE) for using the ZIPNest follows in Table 1 (where Ac(p) is the critical area):

TABLE 1

| | Nest | | | |
|---|---|---|---|---|
| Target | lineWidth | lineSpace | Ac(p = 2.5, x0 = 0.15) | Fixed |
| M1 | 0.16 | 0.17 | 0.033641758 | nestHeight 1900 |
| | 0.16 | 0.18 | 0.031332483 | nestWidth 5800 |
| | 0.16 | 0.20 | 0.027441334 | internalZip 4 |
| | 0.16 | 0.22 | 0.024299601 | externalZip 12 |
| | 0.16 | 0.24 | 0.02171847 | |
| M2 | 0.20 | 0.19 | 0.027620132 | |
| | 0.20 | 0.20 | 0.025940945 | |
| | 0.20 | 0.22 | 0.023057011 | |
| | 0.20 | 0.24 | 0.020675366 | |
| | 0.20 | 0.26 | 0.018680563 | |

In this design of experiment, the ZIPNests are formed in pairs, with each ZIPNest optimized for one or more chip designs corresponding to one or more reticles. A single critical area is used for both the first and second plurality of nested serpentine lines.

The ZIPNest structure provides high fault localization ability. For example, in the exemplary configuration described with reference to FIG. 8, the nest width is about 5800 μm, so the distance (i.e., length of conductor) between pins is (number of turns)* 5800 μm. In this example, the internal ZIPs are placed every four turns, so there is about 23.2 mm between internal ZIPs. The external ZIPs are placed every 8–12 turns, so there is about 46.4–69.6 mm between external ZIPs. These distances are well below 100 mm between ZIPs.

The critical area computation for an exemplary test vehicle is as follows:

Wafer-scale Ac(p=2.5,x0=0.15)

Assume the test vehicle has 50 die/wafer and 288 CPU Die/Wafer

M1 Ac(p)
ZIPNests=13.8 cm$^2$
normal Nests=5.8 cm$^2$
Total Nest Ac(p)=19.6 cm$^2$
CPU Ac(p)=14.1 cm$^2$
M2 Ac(p)
ZIPNests=11.6 cm$^2$
normal Nests=4.9 cm$^2$
Total Nest Ac(p)=16.4 cm$^2$
CPU Ac(p)=14.0 cm$^2$ The total ratio of Metal SF Critical area to CPU critical area is about 1.4–1.2.

The major limiting factor is the width of external ZIP pins for a 23 line nest.

Tighter vertical packing can provide room for 1 more set of 0.16/0.18 and 0.2/0.2 nests, increasing the ratio to 1.6–1.3.

Optionally including the critical area of a large area snake comb can further increase the ratio.

Another exemplary ZIPNest structure has the following specifications. The structure has a 12 line nest instead of a 23 or 16 line nest. There is much reduced overhead for External ZIPs. The width of the external ZIP array is 1080 μm for 12 90-μm pitch external ZIPs vs. 2070 μm for 12 90-μm pitch external ZIPs. A 12 line bundle can still resolve defect sizes within a range of 0.18–4.08 μm. The nest width is 4000 μm (total cell width=5260 μm). This layout allows two columns of nests in each of the M1 and M3 subchips. The result is about 21% pad overhead in nest cell. Using internal ZIPs every 4 turns, one can localize a defect to within 16 mm of line length. If the number of turns per external ZIPs is fewer than 20, it is possible to localize a defect to within 80 mm of line length.

In general, decreasing the number of nest lines decreases external ZIP overhead, but increases the length between external ZIPs because there are more bundle pitches in the nest. Reducing the number of nest lines can significantly decrease the area required by external ZIPs, but increases the length between external ZIPs because the bundle pitch of the nest is tighter (more turns). In some embodiments, the length between external ZIPs is quantized because internal ZIPs are placed every four turns and external ZIPs are constrained to be placed at a multiple of the internal ZIP pitch.

Another aspect of the ZIPNest is the actual design methodology or layout of the test chip, which may contain internal pads, external pads, or a combination of external and internal pads. Beginning with FIG. 9, the elements of an exemplary design are described. The exemplary design includes the optimization of the overhead, number of lines, nest width and wafer critical area. The optimum points of the design would be product dependent, e.g., for the Do (defect density) and critical area parameters, therefore the design methodology has general applicability.

Figure 9:
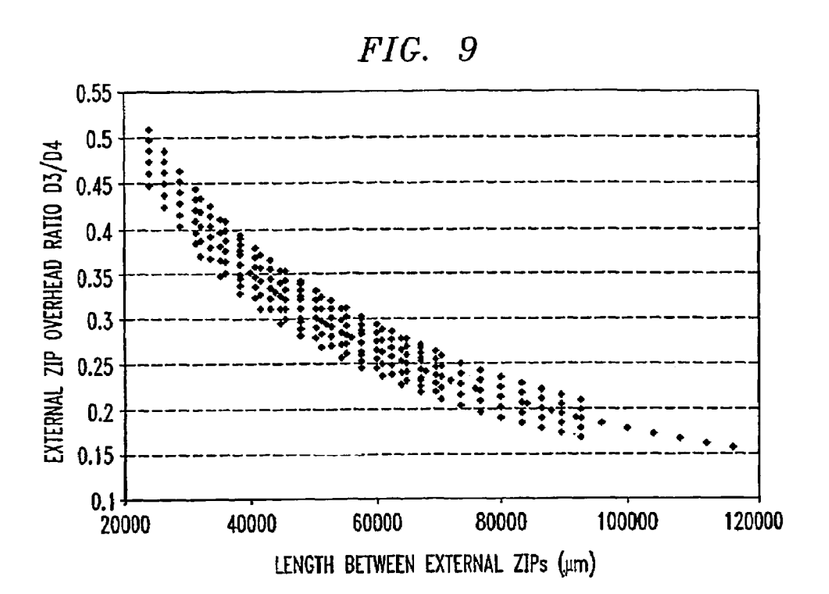
FIG. 9 is a graph showing how external zoom in pin overhead varies with the length between external zoom in pins.

FIG. 9 is a graph showing the external ZIP overhead ratio (given by the ratio of D3/D4 in FIG. 8) plotted against the length between external ZIPs. A complete analysis varied the nest width continuously from 5800 μm down to 2000 μm, and the number of nest lines from 23 down to 12. The overhead generally decreases as the length between external ZIPs increases. In practice, the chip width constrains the best choice of nest widths to avoid wasted space.

Figure 10:
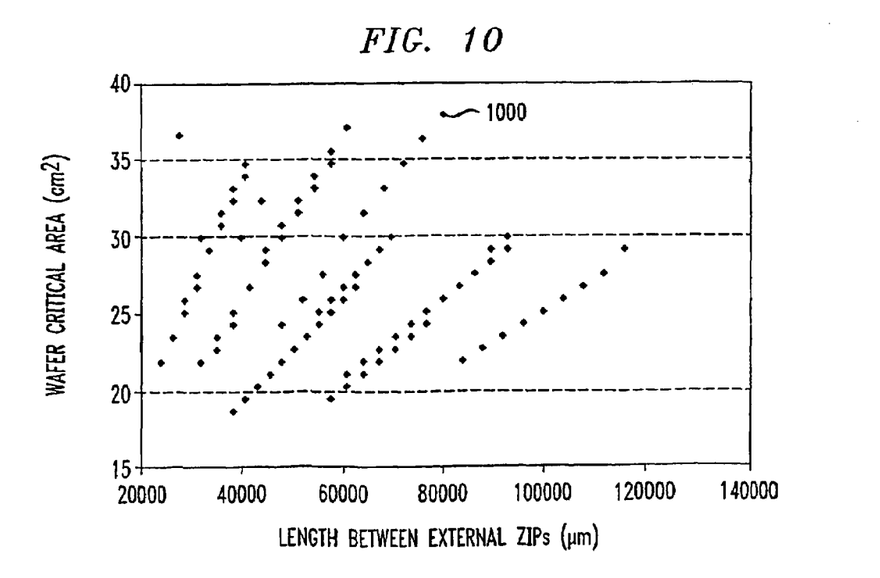
FIG. 10 is a graph showing how wafer critical area varies with the length between external zoom in pins.

FIG. 10 is a graph showing the wafer critical area plotted against the length between external zips. The data are "striped" because certain nest widths do not completely fill a row on the die. These data are based on the assumptions that the pitch p=2.5, x0=0.15. These data do not include sub-DR Nests (i.e., design of experiment levels below design rules). These data include Ac(p) from large area structures (4.3 mm$^2$/die). A preferred point in FIG. 10 for this example has Ac(p)=37.8 cm$^2$ per wafer with 80 mm of line between external ZIPs.

Tables 2A and 2B provide wafer critical area versus the number of lines and nest width for the example.

TABLE 2A

| Min of lengthBetweenEZips quantWaferAc(p) | nlines | | | | | |
|---|---|---|---|---|---|---|
| | 12 | 13 | 14 | 15 | 16 | 17 |
| 18.6784 | | | | | | |
| 19.4772 | | | | | | 57600 |
| 20.276 | | | | 60800 | 60800 | |
| 21.0748 | | 64000 | 64000 | 64000 | | 60800 |
| 21.8736 | 84000 | 67200 | 67200 | | 32000 | 32000 |
| 22.6724 | 88000 | 35200 | 35200 | 67200 | 67200 | 67200 |
| 23.4712 | 92000 | 73600 | | 35200 | 35200 | 35200 |
| 24.27 | 48000 | 38400 | 73600 | 73600 | 73600 | 73600 |
| 25.0688 | 100000 | | 38400 | 38400 | 38400 | 38400 |
| 25.8676 | 52000 | 80000 | 80000 | 80000 | 80000 | 80000 |
| 26.6664 | 108000 | 41600 | 41600 | 41600 | 41600 | 41600 |
| 27.4652 | 56000 | 86400 | 86400 | 86400 | 86400 | 86400 |
| 28.264 | | 44800 | 44800 | 44800 | 44800 | |
| 29.0628 | 116000 | 92800 | 92800 | 92800 | 92800 | 44800 |
| 29.8616 | 40000 | 32000 | 32000 | 32000 | | 92800 |
| 30.6604 | | | | | 48000 | 48000 |
| 31.4592 | 64000 | 51200 | 51200 | | | |
| 32.258 | 44000 | | | 51200 | 51200 | 51200 |

TABLE 2A-continued

| Min of lengthBetweenEZips | nlines | | | | | |
|---|---|---|---|---|---|---|
| quantWaferAc(p) | 12 | 13 | 14 | 15 | 16 | 17 |
| 33.0568 | 68000 | 54400 | | | | |
| 33.8556 | | | 54400 | 54400 | 54400 | 54400 |
| 34.6544 | 72000 | 57600 | | | | |
| 35.4532 | | | 57600 | 57600 | 57600 | |
| 36.252 | 76000 | | | | | |
| 37.0508 | | 60800 | 60800 | | | |
| 37.8496 | 80000 | | | | | |
| Grand Total | 40000 | 32000 | 32000 | 32000 | 32000 | 32000 |

TABLE 2B

| Min of lengthBetweenEZips quantWaferAc(p) | nlines | | | | | | Grand Total |
|---|---|---|---|---|---|---|---|
| | 18 | 19 | 20 | 21 | 22 | 23 | |
| 18.6784 | | | | | 38400 | 38400 | 38400 |
| 19.4772 | | | 40800 | 40800 | 40800 | 40800 | 40800 |
| 20.276 | 43200 | 43200 | 43200 | 43200 | 43200 | 43200 | 43200 |
| 21.0748 | 45600 | 45600 | 45600 | 45600 | 45600 | 45600 | 45600 |
| 21.8736 | 24000 | 24000 | 24000 | 24000 | 24000 | 24000 | 24000 |
| 22.6724 | 50400 | 50400 | 50400 | 50400 | 50400 | 50400 | 35200 |
| 23.4712 | 26400 | 26400 | 26400 | 26400 | 26400 | 26400 | 26400 |
| 24.27 | 55200 | 55200 | 55200 | 55200 | | | 38400 |
| 25.0688 | 28800 | 28800 | 28800 | | 55200 | 55200 | 28800 |
| 25.8676 | 60000 | 60000 | | 28800 | 28800 | 28800 | 28800 |
| 26.6664 | 31200 | | 60000 | 60000 | 60000 | 60000 | 31200 |
| 27.4652 | | 31200 | 31200 | 31200 | 31200 | 31200 | 31200 |
| 28.264 | 64800 | 64800 | 64800 | 64800 | 64800 | 64800 | 44800 |
| 29.0628 | 33600 | 33600 | 33600 | 33600 | 33600 | 33600 | 33600 |
| 29.8616 | 69600 | 69600 | 69600 | 69600 | 69600 | 69600 | 32000 |
| 30.6604 | 36000 | 36000 | 36000 | 36000 | 36000 | | 36000 |
| 31.4592 | | | | | | 36000 | 36000 |
| 32.258 | 38400 | 38400 | 38400 | | | | 38400 |
| 33.0568 | | | | 38400 | | | 38400 |
| 33.8556 | 40800 | | | | | | 40800 |
| 34.6544 | | 40800 | | | | | 40800 |
| 35.4532 | | | | | | | 57600 |
| 36.252 | | | | | | | 76000 |
| 37.0508 | | | | | | | 60800 |
| 37.8496 | | | | | | | 80000 |
| Grand Total | 24000 | 24000 | 24000 | 24000 | 24000 | 24000 | 24000 |

Another aspect of the exemplary design is that it includes "wafer scale" considerations. For example one chip design or multiple chip designs may be included on the wafer. So the ZIPNest trade-offs are optimized for such cases. The critical area Ac(p) is matched at the wafer level rather than die level. This consideration may also be included on test vehicles without ZIPs.

Figure 11:
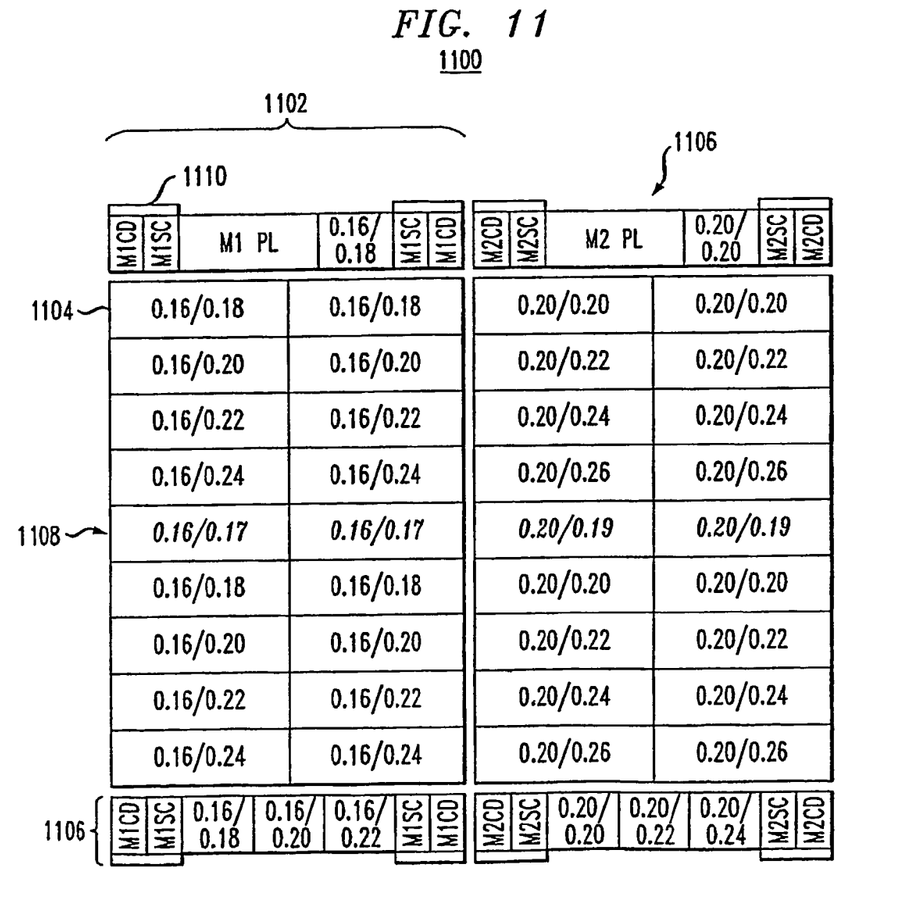
FIG. 11 is a diagram showing the layout of a test wafer having a plurality of subchips, each subchip having a plurality of zoom in pin nests.

FIG. 11 is an exemplary floorplan 1100 showing two subchips 1102, each containing a plurality of ZIPNests 1104 as described above. Each of the ZIPNests has a respective plurality of nested serpentine lines with respective pluralities of test pads optimized for one or more chip designs corresponding to one or more reticles. In this example, there are 11 rows of ZIPNests per sub-chip 1102. There are two columns of ZIPNests 1104 in each sub-chip. Non-ZIPNest structures (e.g., product structures) are located in the top and bottom rows 1106. The exemplary floorplan 1100 includes only one row of sub-DR nests 1108. It is also possible to fit blading zones 1110 or other non-electrical cells above and below the ZIPNest regions.

Figure 15:
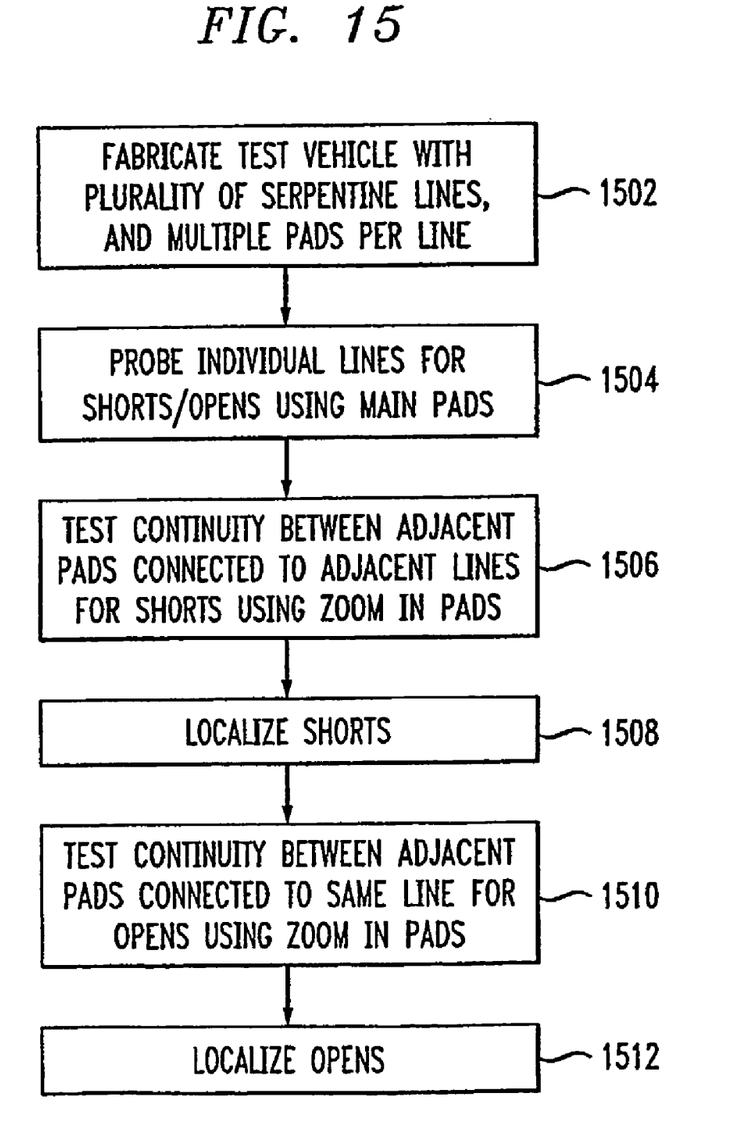
FIG. 15 is a flowchart of a method for localizing shorts and opens using zoom in pins.

Referring to FIG. 15, a general method of testing that uses ZIPs is now described.

At step 1502, a test vehicle is fabricated including a plurality of serpentine lines and multiple pads per line (which may include internal and/or external ZIPs). The external ZIPs divide each nest line into "segments." For example, in one of the configurations described above with reference to FIGS. 2 and 8, there are 23 external ZIPs for each line, dividing each line into 22 segments.

At step 1504 individual lines are probed for shorts and/or opens using the main pads 802. This check can be made using a conventional nest testing algorithm. Assume that a short is found affecting line 202$i$ by this method.

At step 1506, fractional portions of individual ones of the nested serpentine lines are probed for short circuits or opens. Circuit continuity is tested between adjacent pads connected to adjacent lines for shorts using ZIPs. In the example, once a short has been identified, a check is made for leakage between "horizontally adjacent" external ZIPs to localize the short to a given line segment. For example, a check is made for shorts (measuring voltage and current) between pads $204_{i,j}$ and $204_{i,j+1}$ to localize the short to line segment $202_{i,j}$ or segment $202_{i,j-1}$. A check is made for shorts between pads $204_{i+1,j}$ and $204_{i+1,j+1}$ (measuring voltage and current) to localize the short to segment $202_{i,j}$ or $202_{i,j+1}$. Thus, it is possible to localize a defect to a small line segment.

At step 1508, shorts are localized, using the bridge calculation technique described above with reference to FIG. 4B to identify a fractional portion of at least one of the nested serpentine lines that contains a defect based on the probing.

At step 1510, continuity is tested between adjacent pads connected to the same line to detect opens using ZIPs. Once the line having an open is identified, a check of the resistance between "vertically adjacent" external ZIPs is made to localize the open to a given line segment. For example, a check is made for opens between pads $204_{i,j+1}$ and $204_{i+1,j+1}$ (measuring voltage and current) to localize an open to segment j.

At step 1512, opens are localized.

One of ordinary skill understands that either the check for shorts or the check for opens may be performed first. Neither is dependent on the other.

Figure 12:
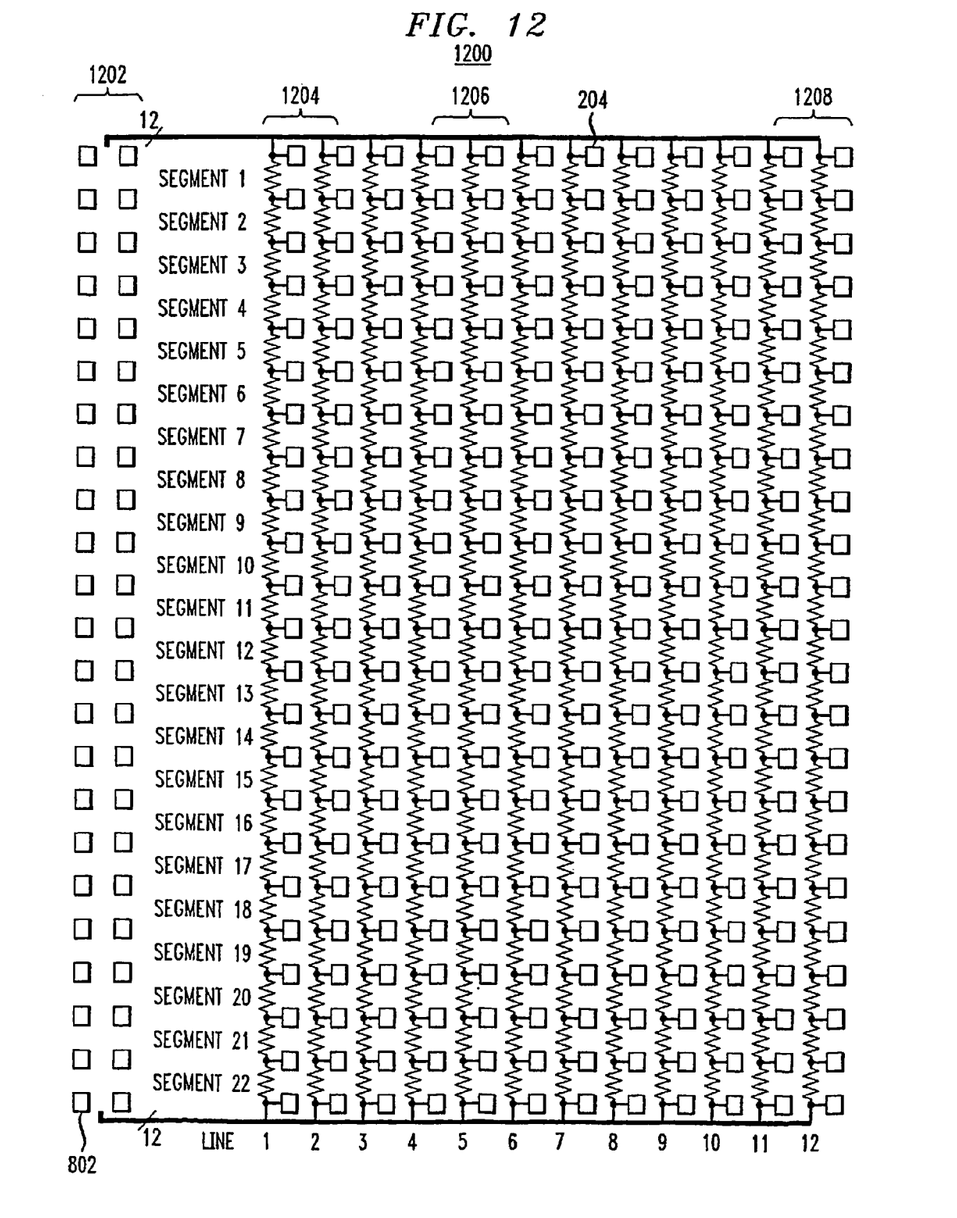
FIG. 12 is a floor plan showing the main pads and zoom in pins for a nest.

FIG. 12 is a diagram showing an exemplary layout of ZIPs and the pads probed for identification and localization of defects. The nest of serpentine lines is omitted from FIG. 12 for clarity. Item 1202 shows the columns of main pads 802. By probing the main pads 802, lines having opens or shorts are identified. Item 1204 shows two columns of external ZIPs that are probed to check for shorts between lines 1 and 2 and opens in line 1. Item 1206 shows two columns of external ZIPs that are probed to check for shorts between lines 4 and 5 and opens in line 5. Item 1208 shows two columns of external ZIPs that are probed to check for shorts between lines 11 and 12 and opens in lines 11 and 12.

For a 12 line M1 ZIPNests, one probe landing on the main pads 802 is used to check open and shorts for all lines. 11 probe landings on external ZIP columns are used to localize opens and shorts. The first external ZIP columns are different from the last external ZIP column. In the first 11 external ZIP columns: (1) leakage between segments of lines i and i+1 is checked; and (2) resistance of each segment of line i is checked. In the last external ZIP column: (1) leakage between segments of lines 11 and 12 is checked; and (2) resistance of each segment of both lines 11 and 12 is checked.

One of ordinary skill will understand that this procedure is generalized to other ZIPNests having different numbers of lines. The last external ZIP column is used to check the resistance of the last two lines. Two tests will fail when a segment is shorted. The common segment in both the two tests is the failing segment. It may be possible to have multiple segments shorted in a given line pair: for example, if there are huge defects (greater than 100 µm), or multiple small defects.

Figure 13:
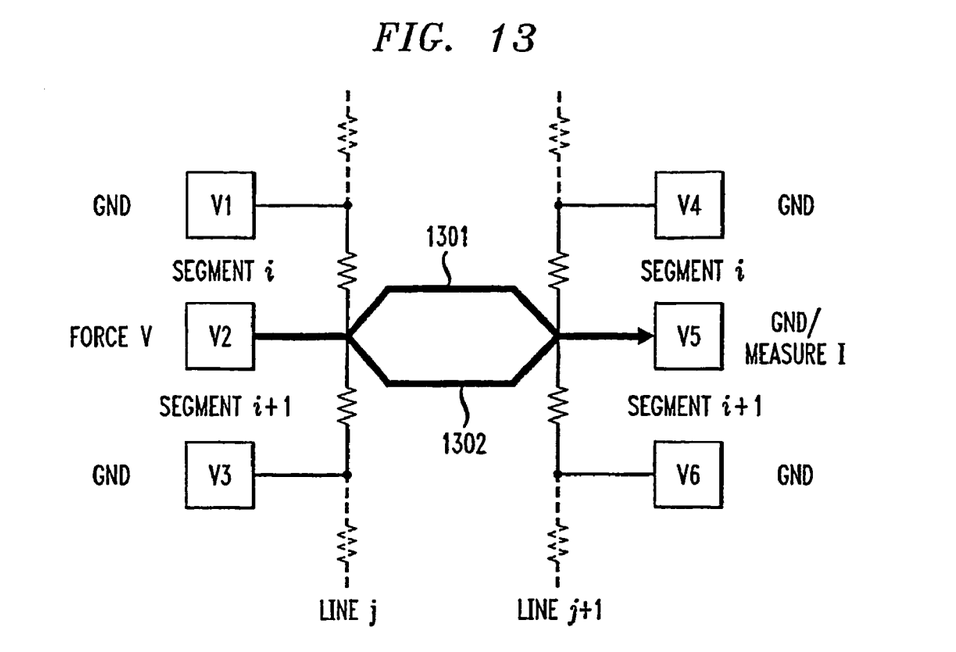
FIG. 13 is a schematic diagram showing the model for measuring the location of a short.

FIG. 13 is a diagram showing details of the method to use 6 pins to test for shorts between pairs of segments. Path 1301 shows the current that flows if there is a short between Segment i's. Path 1302 shows the current that flows if there is a short between Segment i+1's.

Figure 14:
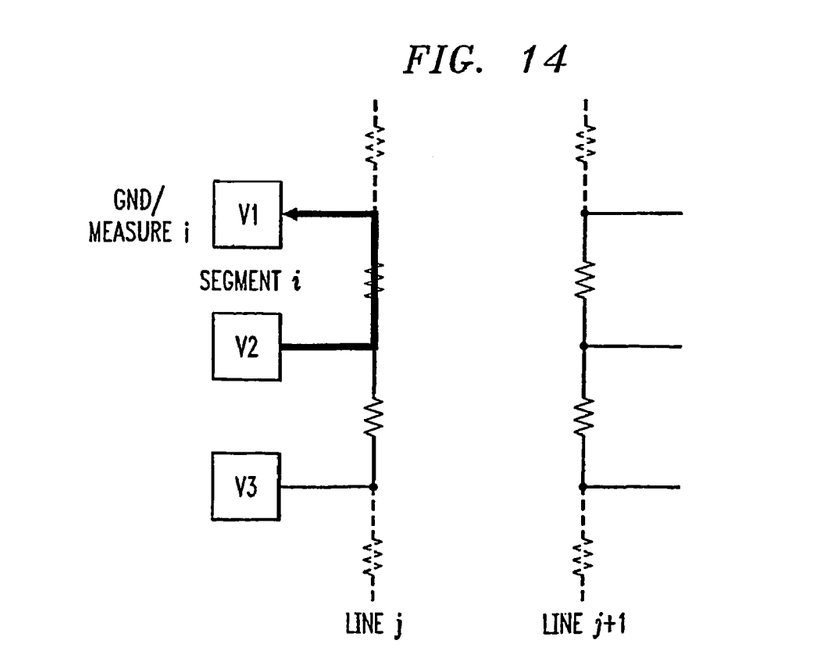
FIG. 14 is a schematic diagram showing the model for measuring the location of an open.

FIG. 14 is a diagram showing how to use two pins to test resistance/open in each segment. Interpreting segment open tests involves measuring for continuity between any consecutive pair of ZIPs for the same line.

A variety of testing routines may be used with the ZIPNest structures described herein. For example, one can perform all measurements on all dies, including every external ZIP measurement on all ZIPNests. This is the easiest test routine to program into automated test equipment. Although very time consuming, it is suitable for test debug.

Another routine involves measuring all "Main Pads" for all structures, and selecting all external ZIP pads for ZIPNests with observed failures. Tests are then performed on selected external ZIP pads. This provides much more efficient test time, but requires the ability to probe different padframes in different dies. This involves more test programming effort.

A third routine measures all "Main Pads" for all structures, and identifies all external ZIP pads for ZIPNests with observed failures, as above. However, only external ZIP pads corresponding to actual lines failing are selected for testing. This provides the best test time possible, but involves a more complex test program.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A test vehicle, comprising
a substrate;
a plurality of nested serpentine conductive lines on the substrate, each serpentine line having a plurality of turn sections that comprise two parallel line segments connected by a perpendicular line segment; and
a plurality of test pads on the substrate, each connected to a respective portion of a respective one of the nested serpentine lines, such that each of a subset of the nested serpentine lines has at least three test pads, each line in the subset including at least two test pads connected to respectively different perpendicular line segments of respectively different turn sections of the serpentine lines, and each pair of consecutive test pads connected to one of the subset of the nested serpentine lines has a respectively different subset of the turn sections of that line connected therebetween.

2. The nest structure of claim 1, wherein a subset of the test pads are positioned externally to the nest structure, such that each of the subset of the test pads is connected between a respective pair of turn sections within the plurality of turn sections.

3. The nest structure of claim 1, wherein at least two consecutive turn sections of one or more of the nested serpentine lines have test pads directly connected thereto.

4. The test vehicle of claim 1, wherein the plurality of nested serpentine lines include between 12 and 23 lines.

5. The test vehicle of claim 1, wherein the test vehicle further comprises:
a second plurality of nested serpentine conductive lines on the same substrate as the first plurality of nested serpentine lines, each having a plurality of turn sections that comprise two parallel line segments connected by a perpendicular line segment, and
a second plurality of test pads on the same substrate, each connected to a respective portion of a respective one of the second plurality of nested serpentine lines, such that each of a subset of the second plurality of nested serpentine lines has at least three test pads, and any two consecutive pairs of the test pads connected to one of the subset of the second plurality of nested serpentine lines have a respectively different subset of the turn sections of that line connected therebetween; and the first and second pluralities of nested serpentine lines and the first and second pluralities of test pads are optimized for one or more chip designs corresponding to one or more reticles.

6. The nest structure of claim 2, wherein the nest structure includes a plurality of rows of test pads, each row having a respective test pad corresponding to each respective one of the plurality of lines, each row being connected at a respectively different intermediate location between ends of the plurality of nested serpentine lines, such that the test pads of any two consecutive rows of test pads are connected to a respectively different bunch of turn sections containing one or more turn sections of each of the nested serpentine lines.

7. The test vehicle of claim 2, wherein each of the subset of the nested serpentine lines includes a test pad in every fourth turn section of that nested serpentine line.

8. The test vehicle of claim 6, wherein the test pads are further arranged in columns, and a pitch between pads within the rows is substantially the same as a pitch between pads within the columns.

9. A test vehicle, comprising
a substrate;
a plurality of nested serpentine conductive lines on the substrate, each serpentine line having a plurality of turn sections that comprise two parallel line segments connected by a perpendicular line segment; and
a plurality of test pads on the substrate, each connected to a respective portion of a respective one of the nested serpentine lines, such that each of a subset of the nested serpentine lines has at least three test pads, and each pair of consecutive test pads connected to one of the subset of the nested serpentine lines has a respectively different subset of the turn sections of that line connected therebetween,
wherein a subset of the test pads are positioned internally in the nest structure, with each of the subset of the test pads directly connected to a respective one of the turn sections.

10. A test vehicle, comprising
a substrate;
a plurality of nested serpentine conductive lines on the substrate, each serpentine line having a plurality of turn sections that comprise two parallel line segments connected by a perpendicular line segment; and
a plurality of test pads on the substrate, each connected to a respective portion of a respective one of the nested serpentine lines, such that each of a subset of the nested serpentine lines has at least three test pads, and each pair of consecutive test pads connected to one of the subset of the nested serpentine lines has a respectively different subset of the turn sections of that line connected therebetween,
wherein at least one of the perpendicular line segments includes one or more comb segments positioned between the corresponding pad and the parallel line segments of that perpendicular line segment.

11. The test vehicle of claim 5, wherein a single critical area is used for both the first and second plurality of nested serpentine lines.

12. A test vehicle, comprising
a substrate;
a plurality of nested serpentine conductive lines on the substrate, each serpentine line having a plurality of turn sections that comprise two parallel line segments connected by a perpendicular line segment; and
a plurality of test pads on the substrate, each connected to a respective turn section of a respective one of the nested serpentine lines, wherein a subset of the test pads are positioned internally in the nest structure, each internally positioned test pad being located within a concavity formed by a turn section of a respective one of the plurality of lines.

13. The nest structure of claim 12, wherein each of the subset of test pads is located between the perpendicular lines segments of a respective adjacent pair of the perpendicular line segments.

14. A test vehicle, comprising
a substrate;
a plurality of nested serpentine conductive lines on the substrate, each serpentine line having a plurality of turn sections that comprise two parallel line segments connected by a perpendicular line segment; and
a plurality of test pads on the substrate, each connected to a respective turn section of a respective one of the nested serpentine lines, wherein a subset of the test pads are positioned internally in the nest structure,
wherein at least one of the perpendicular line segments includes one or more comb segments positioned between the corresponding pad and the parallel line segments of that perpendicular line segment.

15. The nest structure of claim 12, wherein at least two consecutive turn sections of one or more of the nested serpentine lines have test pads directly connected thereto.

16. A test vehicle, comprising
a substrate;
a plurality of nested serpentine conductive lines on the substrate, each serpentine line having a plurality of turn sections that comprise two parallel line segments connected by a perpendicular line segment; and
a plurality of test pads on the substrate, each connected to a respective turn section of a respective one of the nested serpentine lines, wherein a subset of the test pads are positioned internally in the nest structure,
wherein each of the subset of the nested serpentine lines includes at least one test pad for every twenty turn sections.

17. A test vehicle, comprising
a substrate;
a plurality of nested serpentine conductive lines on the substrate, each serpentine line having a plurality of turn sections that comprise two parallel line segments connected by a perpendicular line segment; and
a plurality of test pads on the substrate, each connected to a respective portion of a respective one of the nested serpentine lines, such that each of a subset of the nested serpentine lines has at least three test pads, two of the three test pads connected between a first turn section and a second turn section, with a third turn section connected between the two test pads.

18. The nest structure of claim 17, wherein a subset of the test pads are positioned internally in the nest structure.

19. The nest structure of claim 17, wherein each of the subset of test pads is located between the perpendicular lines segments of a respective adjacent pair of the perpendicular line segments.

20. A test vehicle, comprising
a substrate:
a plurality of nested serpentine conductive lines on the substrate, each serpentine line having a plurality of turn sections that comprise two parallel line segments connected by a perpendicular line segment; and
a plurality of test pads on the substrate, each connected to a respective portion of a respective one of the nested serpentine lines, such that each of a subset of the nested serpentine lines has at least three test pads, and each pair of test pads connected to one of the subset of the nested serpentine lines has at least a respectively different turn section portion connected therebetween, wherein at least one of the perpendicular line segments includes one or more comb segments positioned between the corresponding pad and the parallel line segments of that perpendicular line segment.

21. The nest structure of claim 17, wherein at least two consecutive turn sections of one or more of the nested serpentine lines have test pads directly connected thereto.

22. A method of testing, comprising the steps of:
(a) fabricating a test vehicle having a plurality of nested serpentine lines;
(b) probing fractional portions of individual ones of the nested serpentine lines for short circuits or open circuits, the fractional portions including at least two test pads directly connected to respectively different perpendicular line segments of respectively different turn sections of the same serpentine line; and
(c) identifying a fractional portion of at least one of the nested serpentine lines that contains a defect based on the probing.

23. The method of claim 22, wherein the probing step includes testing continuity between two pads, each pad abutting and continuous with a respective turn section of the same one of the lines, to test for an open circuit within a fractional portion of that line between the two pads.

24. The method of claim 22, wherein the probing step includes testing continuity between two pads, each pad abutting and continuous with a turn section of a respectively different one of the lines, to test for a short circuit connecting corresponding fractional portions of the two lines connected to the two pads.

25. The method of claim 22, wherein the probing step includes testing continuity between two pads positioned externally to the nested serpentine lines, each pad connected to a respective turn section of the same one of the lines, to test for an open circuit within a fractional portion of that line between the two pads.

26. The method of claim 22, wherein the probing step includes testing continuity between two pads positioned externally to the nested serpentine lines, each pad connected to a turn section of a respective one of the lines, to test for a short circuit connecting corresponding fractional portions of the two lines connected to the two pads.

27. A method of testing, comprising the steps of:
(a) fabricating a test vehicle having a plurality of nested serpentine lines;
(b) probing fractional portions of individual ones of the nested serpentine lines for short circuits or open circuits, including measuring voltage and current at four of the pads connected to corresponding fractional portions of two of the lines; and
(c) identifying a fractional portion of at least one of the nested serpentine lines that contains a defect based on the probing, including determining a location of the defect within the fractional portions of the lines from the voltage and current measurements, based on a bridge calculation.

28. A method of testing, comprising the steps of:
(a) fabricating a test vehicle having a plurality of nested serpentine lines;
(b) probing fractional portions of individual ones of the nested serpentine lines for short circuits or open circuits, including rotating the test vehicle between probing for shorts and probing for opens; and
(c) identifying a fractional portion of at least one of the nested serpentine lines that contains a defect based on the probing.

* * * * *